United States Patent
Mittel

(10) Patent No.: US 6,356,142 B1
(45) Date of Patent: Mar. 12, 2002

(54) DIGITAL FILTER TUNE LOOP

(75) Inventor: James Gregory Mittel, Lake Worth, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/666,037

(22) Filed: Sep. 20, 2000

(51) Int. Cl.⁷ ............................................... H03K 5/00
(52) U.S. Cl. ...................................... 327/553; 327/552
(58) Field of Search ............................... 327/552, 553, 327/554; 330/305

(56) References Cited

U.S. PATENT DOCUMENTS 5,245,646 A * 9/1993 Jackson et al. ............. 327/553
5,745,001 A * 4/1998 Ueshima et al. ............ 327/553
5,914,633 A * 6/1999 Comino et al. ............. 327/552

OTHER PUBLICATIONS

Roland E. Best, "Phase–Locked Loops" McGraw–Hill, 1999, pp. 177–210.

* cited by examiner

*Primary Examiner*—Dinh T. Le
(74) *Attorney, Agent, or Firm*—Phillip M. Macnak; Andrew S. Fuller

(57) ABSTRACT

A digital tuning circuit (100) for a filter (120) has a filter input and a filter output and employs a switchable element array (122). The filter includes a tuning signal generator (104) that generates a tuning signal (106) that is delivered to the filter input and a clock circuit (102) that generates a periodic stream of pulses. The digital tuning circuit includes a delay circuit (110), a phase comparator (130) and an integrating up-down counter (140). The delay circuit (110) is responsive to the tuning signal generator (104) and delays the tuning signal (106) by a predetermined amount corresponding to the nominal delay through the filter (120). The integrating up-down counter (140) counts pulses in a first direction when the phase comparator (130) generates the first value and counts pulses in a second direction, opposite from the first direction, when the phase comparator (130) generates the second value. The integrating up-down counter (140) generates a binary word having a value corresponding to a number of counts that the integrating up-down counter (140) performs and is coupled to the switchable element array (122) so that a number of switchable elements is electrically coupled to the filter (120). The number of switchable elements corresponds to the value of the binary word.

11 Claims, 2 Drawing Sheets

DIGITAL FILTER TUNE LOOP

BACKGROUND OF THE INVENTION

1. Field of the Invention

The present invention relates to communications systems and, more specifically, to tunable filters used in communications systems.

2. Description of the Prior Art

Many communications devices include filters to filter out noise and that modulate and demodulate signals. These filters typically consist of capacitors and resistors and have a predictable frequency response based on the capacitance of the capacitors and the resistance of the resistors used. The predictability of the frequency response is tied to the precision of the capacitors and the resistors. If, for example, a filter includes capacitors and resistors that have precisely known capacitance and resistance, respectively and that are immune to variations in operating temperature, then the frequency characteristic of the resulting filter would also be known, irrespective of the environment in which it was used.

Unfortunately, many capacitors and resistors have parameter values that deviate from their rated parameter values within a known range. Also, the parameter values of such elements tend to vary widely with certain environmental factors, such as temperature. Therefore, to achieve the precision required for certain communications systems, the filters in a system are calibrated prior to use. Typically, a filter in a communications system will include a array of switchable elements. For example, a filter could include an array of capacitors, each of which is coupled to the filter through a controllable switch. Thus, if a given switch is closed, a corresponding capacitor is coupled to the filter and if the switch is open, the capacitor is isolated from the total filter capacitance.

The communications system will undergo a calibration process in which a tuning signal generator sends a tuning signal, having a frequency equal to the target frequency of the filter, to drive the filter and a delay circuit in parallel with the filter. The tuning signal could be at a frequency other than the target frequency of the filter. In such a case, the delay of the reference path would be other than 45 degrees for a first order filter. The delay circuit delays the tuning signal by an amount of time corresponding to the delay expected from the filter for a signal having a frequency equal to the target frequency. The difference in the delay through the filter and through the delay circuit is determined by comparing the leading edge of the tuning signal from the filter to the leading edge of the tuning signal from the delay circuit. A counter, triggered by a clock circuit, counts the time between the leading edges and activates a number of switchable elements corresponding to the number of counts of the counter. Because the counter lacks resolution superior to that of the clocking circuit, the precision of the filter tuning process for a first order filter is limited by the resolution of the clocking circuit. Unfortunately, many existing clocking circuits have clocking speeds limited by the available system clock.

Therefore, there is a need for a switchable element array-type filter tuning circuit that has a precision greater than the precision of the clocking circuit used by the tuning circuit.

DETAILED DESCRIPTION OF THE INVENTION

Figure 1:
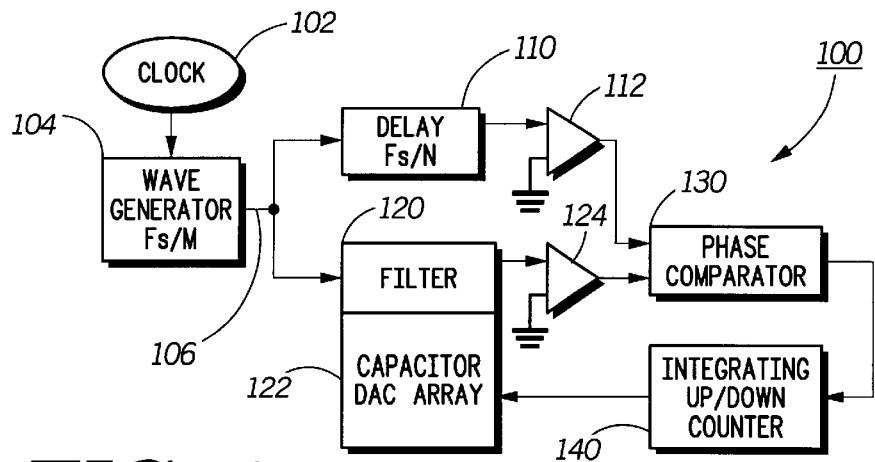
FIG. 1 is a schematic diagram of one embodiment of the invention.

As shown in FIG. 1, one embodiment of the present invention is a digital tuning circuit 100 for a filter 120, having a filter input and a filter output and employing a switchable element array 122. The filter includes a tuning signal generator 104, such as a synthesized sine wave generator, that generates a tuning signal 106 delivered to the filter input and a clock circuit 102. The clock circuit 102 generates a periodic stream of pulses. The digital tuning circuit 100 includes a delay circuit 110, a phase comparator 130 and an integrating up-down counter 140. The delay circuit 110 is responsive to the tuning signal generator 104 and delays the tuning signal 106 by a predetermined amount corresponding to the nominal delay through the filter 120. A first comparator 124 compares the signal received from the filter 120 to a reference value and generates a square wave output corresponding to the output of the filter 120. To compensate for the delay introduced by the first comparator 124, a second comparator 112 adds additional delay to the signal received from delay circuit 110. The integrating up-down counter 140 counts pulses in a first direction when the phase comparator 130 generates a first value and counts pulses in a second direction, opposite from the first direction, when the phase comparator 130 generates a second value. The integrating up-down counter 140 generates a binary word having a value corresponding to a number of counts that the integrating up-down counter 140 performs and is coupled to the switchable element array 122 so that a number of switchable elements is electrically coupled to the filter 120. The switchable elements could comprise capacitors, resistors or other electronic elements that affect the delay characteristics of a filter. The number of switchable elements corresponds to the value of the binary word.

Figure 2:
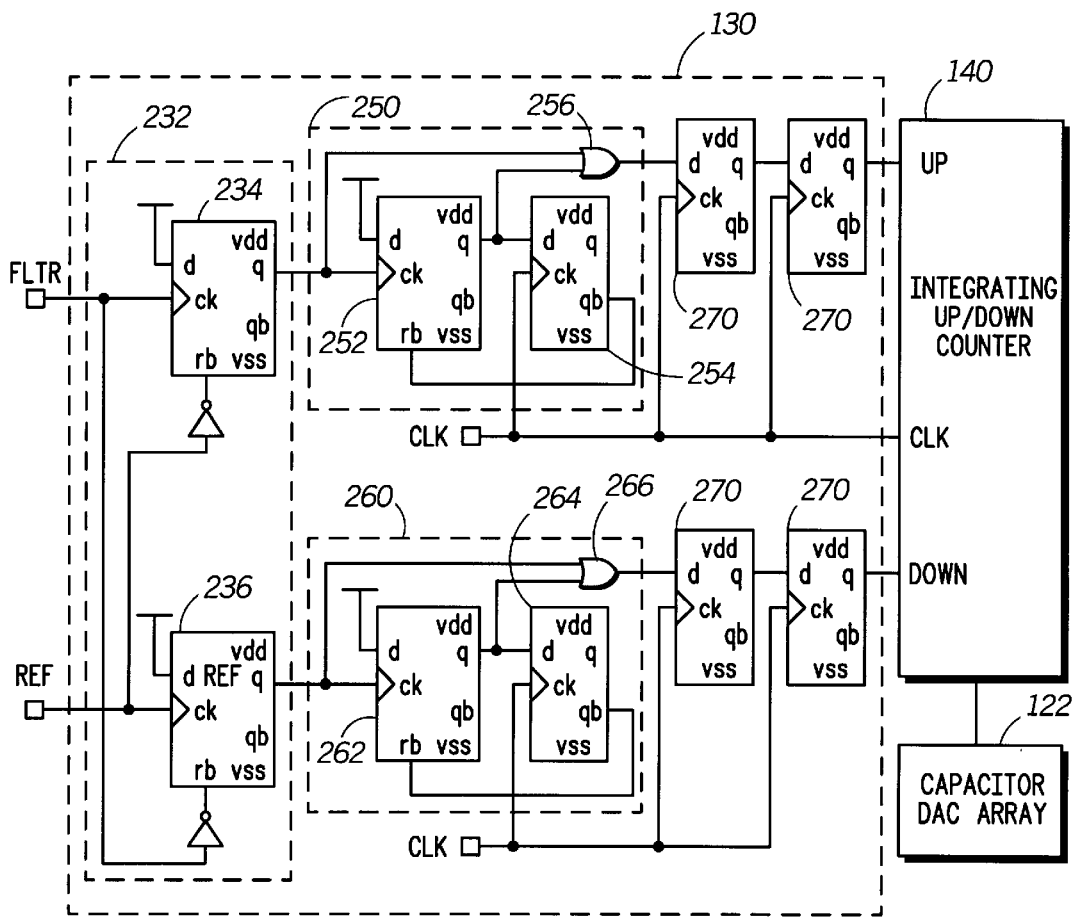
FIG. 2 is a schematic diagram showing details of the phase comparator.

As shown in FIG. 2, the phase comparator 130 includes and edge detector circuit 232 that detects the leading (or trailing) edges of the signals received from the delay circuit and the filter circuit. The edge detector circuit includes a first edge detector 234 that detects a first transitional edge of a first FLTR signal received from the filter output and a second edge detector 236 that detects a second transitional edge of a second REF signal received from the delay circuit.

The first edge detector 234 comprises a first flip-flop having a d-input that is tied to a fixed voltage, a first clock input responsive to the first FLTR signal and a first reset input responsive to an inverted copy of the second REF signal. A first q-output is asserted when the first FLTR signal is asserted (indicating arrival of the leading edge of the first FLTR signal prior to arrival of the leading edge of the second REF signal) and is reset when the second REF signal is asserted (indicating arrival of the leading edge of the second REF signal). The second edge detector 236 comprises a second flip-flop having a d-input that is tied to the fixed voltage, a second clock input responsive to the second REF signal and a second reset input responsive to an inverted copy of the first FLTR signal. The second flip-flop has and a second q-output that is asserted when the second REF signal is asserted (indicating arrival of the leading edge of the second REF signal prior to arrival of the leading edge of the first FLTR signal) and is reset when the first FLTR signal is asserted (indicating arrival of the leading edge of the first FLTR signal).

A first hold circuit 250 holds the output of the first edge detector 234 until the end of a current pulse from the stream of pulses from the clock circuit CLK. Similarly, a second hold circuit 260 holds the output of the second edge detector 236 until the end of a current pulse from the stream of pulses from the clock circuit CLK. The first hold circuit 250 includes a flip-flop 252 having its d-input tied to a fixed voltage, a clock input that is coupled to the q-output of the first edge detector 234, and a reset input that is coupled to a feedback line. Another flip-flop 254 receives the q-output from flip-flop 252 as a d-input. This flip-flop 254 is clocked by the clock signal CLK and outputs an inverted version of its d-input to be fed back to the reset input of flip-flop 252. The q-output of edge detector 234 and flip-flop 252 are OR'ed together with a logic gate 256 so that the output of the logic gate 256 is asserted for at least one clock cycle if the leading edge of the first FLTR signal arrives prior to the leading edge of the second REF signal, even if the time elapsed between the arrival of the two transitional edges is less than one clock cycle. Similarly, a second hold circuit 260 includes two flip-flops 262 and 264 and a logic gate 266 connected together in the same manner as the first hold circuit 250, described above.

A pair of flip-flops 270 can be added to the outputs of the first hold circuit 250 and the second hold circuit 260 to synchronize the outputs to the clock signal CLK. This is necessary because the integrating up-down counter is a state machine triggered by the clock signal CLK, whereas the outputs of the hold circuits 250 and 260 are generated by analog events relating to the delay between the leading edges of the FLTR and REF signals.

As mentioned above, the integrating up-down counter 140 has an UP input logically coupled to logic gate 256, a DOWN input logically coupled to logic gate 266 and a CLK input. The integrating up-down counter 140 can be embodied as a state machine that counts in an upward direction when the UP output is asserted and counts in a downward direction when the DOWN output is asserted. The integrating up-down counter 140 generates a binary word having a value corresponding to a number of counts that the integrating up-down counter 140 performs. The binary word is then sent to the switchable element array 122 and the number of switchable elements that are electrically coupled to the filter corresponds to the value of the binary word. Because the delay through the filter depends on the number of switchable elements so coupled, the value of the binary word controls the delay through the filter.

The hold circuits 250 and 260 ensure that the integrating up-down counter 140 always count at least one count in either the up direction or the down direction even if the space between the leading edge of the FLTR signal and the REF signal (or vise-versa) is less than one cycle of the CLK signal. Because the integrating up-down counter 140 has the ability to count when the transitional edges are within one count, the number of switchable elements from the switchable element array 122 that are coupled to the filter is limited only by the resolution of the switchable element array 122, not the resolution of the CLK signal.

Figure 3:
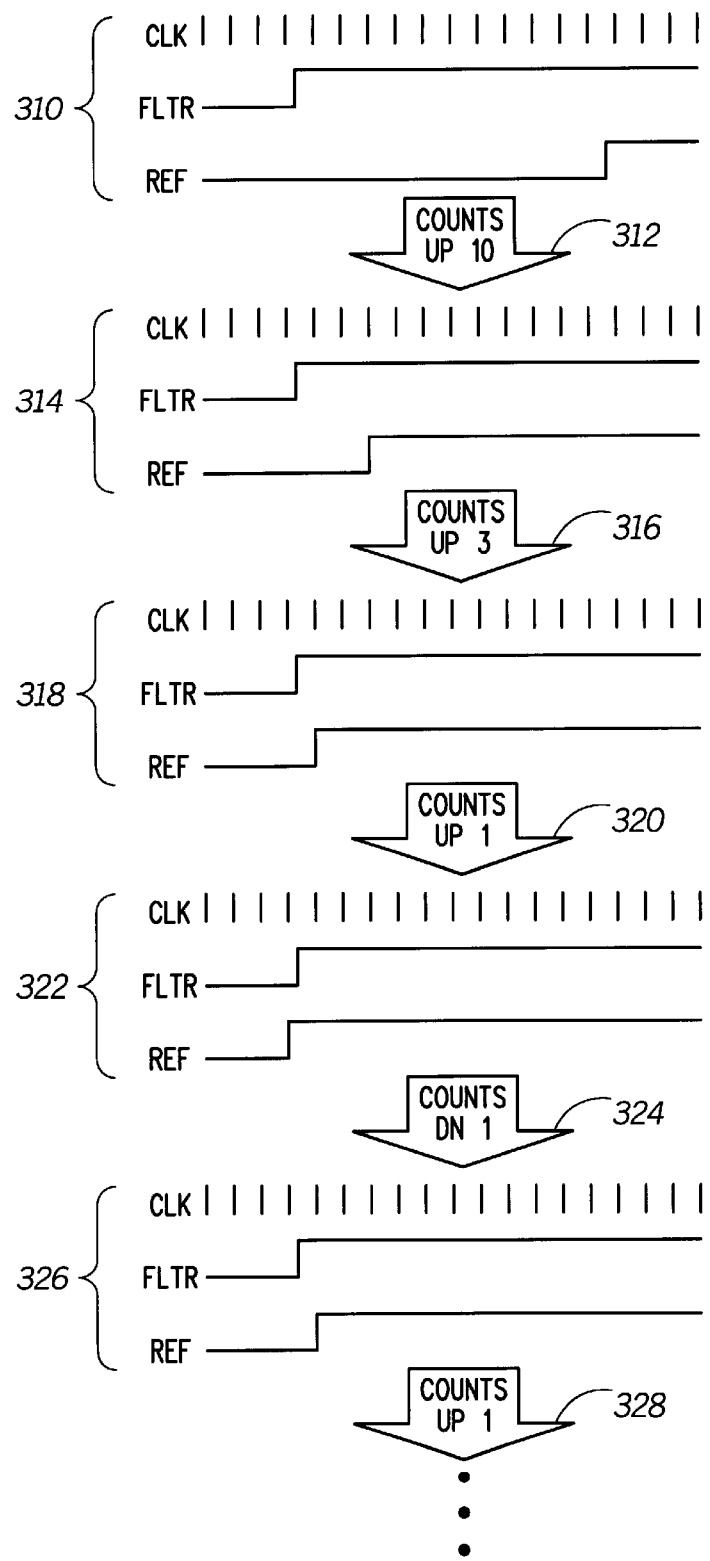
FIG. 3 is a timing diagram demonstrating one illustrative scenario of the invention in use.

One scenario of a calibration sequence according to the present invention is demonstrated in FIG. 3. Initially 310, the leading edge of the FLTR signal occurs slightly more than ten clock cycles before the leading edge of the REF signal. The integrating up-down counter counts in the upward direction for ten counts 312. This causes ten of the switchable elements to be added to the filter (or subtracted, depending on the type of switchable element used). In the next tuning signal cycle 314, the leading edge of the FLTR signal arrives slightly more than three counts before the leading edge of the REF signal. The integrating up-down counter counts in the upward direction for three counts 316 and three more of the switchable elements are added to the filter. On the next cycle 318, the leading edge of the REF signal occurs less than one count after the leading edge of the FLTR signal. This causes the integrating up-down counter to count in the upward direction for one count 320 and one more switchable element is added to the filter. On the next cycle 322 the leading edge of the REF signal actually occurs slightly less than one count before the leading edge of the FLTR signal. This causes the integrating up-down counter to count in the downward direction one count 324. Now, the leading edge of the REF signal trails the leading edge of the FLTR signal by less than one count 326 and the integrating up-down counter counts up one count 328. The system is now in a state of equilibrium and will continue to dither between counting up one and down one until the end of the calibration period.

The above described embodiments are given as illustrative examples only. It will be readily appreciated that many deviations may be made from the specific embodiments disclosed in this specification without departing from the invention. Accordingly, the scope of the invention is to be determined by the claims below rather than being limited to the specifically described embodiments above.

What is claimed is:

1. A digital tuning circuit for a filter, having a filter input and a filter output and employing a switchable element array, the filter including a tuning signal generator that generates a tuning signal that is delivered to the filter input, the digital tuning circuit comprising:

a delay circuit, responsive to the tuning signal generator, that delays the tuning signal by a predetermined amount;

a clock circuit that generates a periodic stream of pulses to said tuning signal generator;

a phase comparator that generates a phase comparator output and that includes a first edge detector that detects a first transitional edge of a first signal received from the filter output and a second edge detector that detects a second transitional edge of a second signal received from the delay circuit, wherein the phase comparator generates, as the phase comparator output, a first value upon detection of the first transitional edge prior to detection of the second transitional edge, and ceases to generate the first value upon detection of the second transitional edge, and generates, as the phase comparator output, a second value, different from the first value, upon detection of the second transitional edge prior to detection of the first transitional edge, and ceases to generate the second value upon detection of the first transitional edge;

a hold circuit that holds the phase comparator output until a pulse from the periodic stream of pulses is asserted; and an integrating up-down counter, responsive to the hold circuit, that counts pulses from the clock circuit in a first direction when the phase comparator generates the first value and that counts pulses from the clock circuit in a second direction, opposite from the first direction, when the phase comparator generates the second value, the integrating up-down counter generating a binary word having a value corresponding to a number of counts that the integrating up-down counter performs, the integrating up-down counter being coupled to the switchable element array so that a number of switchable elements is electrically coupled to the filter, wherein the number of switchable elements corresponds to the value of the binary word.

2. The digital tuning circuit of claim 1, wherein the phase comparator comprises:
   a first flip-flop having a d-input that is tied to a fixed voltage, a first clock input responsive to the first signal, a first reset input responsive to an inverted copy of the second signal and a first q-output that is asserted when the first signal is asserted and that is reset when the second signal is asserted; and
   a second flip-flop having a d-input that is tied to the fixed voltage, a second clock input responsive to the second signal, a second reset input responsive to an inverted copy of the first signal and a second q-output that is asserted when the second signal is asserted and that is reset when the first signal is asserted.

3. The digital tuning circuit of claim 2, wherein the hold circuit comprises:
   a third flip-flop having a d-input that is tied to a the fixed voltage, a third clock input responsive to the first q-output, a third reset input and a third q-output;
   a fourth flip-flop having a d-input that is that is responsive to the third q-output, a third clock input responsive to the periodic stream of pulses from the clock circuit, and a fourth q-inverted output, the fourth q-inverted output electrically coupled to the third reset input; and
   a first logic gate that logically OR's the first q-output with the third q-output.

4. The digital tuning circuit of claim 3, wherein the phase comparator further comprises at least one clocking flip-flop, responsive to the first logic gate and the clock circuit, that generates an up output electrically coupled to the integrating up-down counter, wherein the up output is asserted upon triggering by a clock signal when the first logic gate is generating an asserted value.

5. The digital tuning circuit of claim 3, wherein hold circuit comprises:
   a fifth flip-flop having a d-input that is tied to the fixed voltage, a fifth clock input responsive to the first q-output, a fifth reset input and a fifth q-output;
   a sixth flip-flop having a d-input that is that is responsive to the fifth q-output, a fifth clock input responsive to the periodic stream of pulses from the clock circuit, and a sixth q-inverted output, the sixth q-inverted output electrically coupled to the fifth reset input; and
   a second logic gate that logically OR's the second q-output with the fifth q-output.

6. The digital tuning circuit of claim 5, wherein the phase comparator further comprises at least one clocking flip-flop, responsive to the second logic gate and the clock circuit, that generates a down output electrically coupled to the integrating up-down counter, wherein the down output is asserted upon triggering by a clock signal when the second logic gate is generating an asserted value.

7. A filter having a filter input and a filter output, comprising:
   a tuning signal generator that generates a tuning signal for a preselected amount of time, the tuning signal generator having a tuning signal output that is electrically coupled to the filter input so that a first portion of the tuning signal is processed through the filter;
   a clock circuit that generates a periodic stream of pules to said tuning signal generator;
   a first comparator, responsive to the filter output, that detects zero crossings of a first portion of the tuning signal received from the,filter output and that generates a first square wave corresponding to the filter output;
   a delay path, having a delay path output, electrically in parallel with the filter and electrically coupled to the tuning signal output so that a second portion of the tuning signal is process through the delay path, the delay path delaying the second portion of the tuning signal by an amount corresponding to an nominal delay for the filter;
   a second comparator that adds a delay to the delay path output that corresponds to a delay in the first portion of the tuning signal added by the first comparator and that generates a second square wave corresponding to the delay path output;
   a phase comparator that:
      generates a first value upon detection of a first transitional edge of the first square wave prior to detection of a second transitional edge of the second square wave and that ceases to generate the first value upon detection of the second transitional edge of the second square wave, the phase comparator including a circuit that holds the first value until a next clock pulse of the periodic stream of pulses is asserted, and
      generates a second value upon detection of the second transitional edge of the second square wave prior to detection of the first transitional edge of the first square wave and that ceases to generate the second value upon detection of the first transitional edge of the first square wave, the phase comparator including a circuit that holds the second value until a next clock pulse of the periodic stream of pulses is asserted;
   an integrating up-down counter, responsive to the phase comparator, that counts in a first direction when the phase comparator generates the first value and that counts in a second direction, opposite the first direction, when the phase comparator generates the second value, the integrating up-down counter generating a binary word having a value corresponding to a number of counts that the integrating up-down counter performs; and
   wherein said filter comprising
   an array of switchable elements, each of the switchable elements being electrically coupled to a corresponding bit of the binary word generated by the integrating up-down counter, each of the switchable elements including a switch that couples a switchable element to the filter when a corresponding bit of the binary word has a first value and that de-couples the switchable element from the filter when the corresponding bit of the binary word has a second value different from the first value, so that the number of switchable elements, corresponding to the value of the binary word, is coupled to the filter, wherein delay through the filter corresponds to the number of switchable elements coupled to the filter.

8. The filter of claim 7, wherein the array of switchable elements comprises an array of switchable capacitors.

9. The filter of claim 7, wherein the array of switchable elements comprises an array of switchable resistors.

10. The filter of claim 7, wherein the phase comparator comprises:
   a first flip-flop having a d-input that is tied to a fixed voltage, a first clock input responsive to the first square wave, a first reset input responsive to an inverted copy of the second square wave and a first output that is asserted when the first square wave is asserted and that is reset when the second square wave is asserted; and a second flip-flop having a d-input that is tied to the fixed voltage, a second clock input responsive to the second square wave, a second reset input responsive to an inverted copy of the first square wave and a second output that is asserted when the second square wave is asserted and that is reset when the first square wave is asserted.

11. A method of tuning a filter having an array of switchable elements, comprising reiteratively executing during a tuning period the steps of:

generating a tuning signal to an input terminal of the filter;

driving a first portion of the tuning signal through the filter;

delaying, with a delay circuit, a second portion of the tuning signal by a fixed delay;

comparing an output of said filter and an output of said delay circuit to generate a phase error signal, counting at least one count representing said phrase error signal with an integrating up-down counter during a period between a first transitional edge of the tuning signal received from the filter and a second transitional edge of the second portion of the tuning signal from the delay circuit, wherein counting progresses in a first direction when the first transitional edge occurs before the second transitional edge and progresses in a second direction, opposite from the first direction, when the second transitional edge occurs before the first transitional edge; and selecting a number of said switchable elements of the filter responsive to a number of counts stored in the integrating up-down counter.

* * * * *